United States Patent [19]
Riley

[11] Patent Number: 5,832,490
[45] Date of Patent: Nov. 3, 1998

[54] LOSSLESS DATA COMPRESSION TECHNIQUE THAT ALSO FACILITATES SIGNAL ANALYSIS

[75] Inventor: Michael Joseph Riley, Groveland, Mass.

[73] Assignee: Siemens Medical Systems, Inc., Iselin, N.J.

[21] Appl. No.: 657,855

[22] Filed: May 31, 1996

[51] Int. Cl.$^6$ .................................................. G06F 17/30
[52] U.S. Cl. ............................................. 707/101; 341/77
[58] Field of Search .............................. 707/101; 341/77; 207/503

[56] References Cited

U.S. PATENT DOCUMENTS

| | | | |
|---|---|---|---|
| 3,703,688 | 11/1972 | Flanagan | 341/77 |
| 4,087,754 | 5/1978 | Song | 375/247 |
| 4,201,958 | 5/1980 | Ahamed | 341/43 |
| 4,433,423 | 2/1984 | Golding | 375/249 |
| 4,654,877 | 3/1987 | Shimoni | 382/236 |
| 4,839,649 | 6/1989 | Imai et al. | 341/65 |
| 4,870,415 | 9/1989 | Van Maren et al. | 341/94 |
| 5,014,284 | 5/1991 | Langer et al. | 375/249 |
| 5,041,830 | 8/1991 | Abe | 341/77 |
| 5,345,233 | 9/1994 | Nagata et al. | 341/76 |

OTHER PUBLICATIONS

Kim et al., "Block Delta Modulation For Compression of Surveillance Video Signals", IEEE Transactions on Consumer Electronics, vol. 40, No. 3, Aug., 1994, pp. 458–465.

Ng et al., "Survey of Voiceband Data Signal Compression", IEEE WESCANEX 95. Communications, Power and Computing Conference Proceedings, 15–16 May 1995, Winnepeg, Canada, pp.361–365.

"ECG Data Compression Techniques—A Unified Approach", Jalaleddine et al., IEEE Transactions on Biomedical Engineering, vol. 37, No. 4, Apr. 1990, pp. 329–343.

*Primary Examiner*—Paul R. Lintz
*Attorney, Agent, or Firm*—Lawrence C. Edelman

[57] ABSTRACT

A data compression method and apparatus for processing a stream of original data samples to produce a compressed data stream that comprises both compressed and not-compressed data samples. The technique includes a data compression means for applying a data compression technique to said original data samples so as to develop a sequence of compressed original samples and not-compressed original samples, and providing the sequence of samples in a data portion of a transmission packet. A compression indicator means is also provided for developing a sequence of bits indicating which of the samples in the compressed data stream are representative of one of the compressed original samples and not-compressed original samples, and providing the sequence of bits in a map portion of the transmission packet. The map portion of the transmission packet is used for rapid identification and decompression of the compressed data. In accordance with a further aspect of the invention, the map portion is also used as an indicator of a characteristic of the original data.

13 Claims, 3 Drawing Sheets

LOSSLESS DATA COMPRESSION TECHNIQUE THAT ALSO FACILITATES SIGNAL ANALYSIS

BACKGROUND

1. Field of the Invention

The present invention relates generally to data compression techniques, and more particularly to a lossless data compression technique useful for compression of ECG (electrocardiographic) waveform data.

2. Description of the Prior Art

Generally, data compression is necessary whenever data must be transmitted over a channel having a bandwidth which is lower than the bandwidth of the channel in which it is currently being carried. The technique of the present invention has particular application to data compression of ECG waveform data, which typically requires compression if it is to be transmitted over a low bandwidth channel, such as a wireless link, after it has been acquired. Various types of prior art data compression schemes exist that are readily adaptable for ECG waveform data. Although the present invention is useful in conjunction with many types of data compression schemes, its use will be described in combination with a type of direct data compression using differential pulse code modulation (DPCM) called delta modulation compression. Delta modulation compression is a simple form of predictive coding, in that it assumes ("predicts") that the change in value ("delta") of the next sample in a data stream is within some specified limit of the value of the previous sample. Thus, the initial sample value of the compressed data stream is an uncompressed original sample (using, for example, 16 bits), and thereafter only a delta value (using, for example, 8 bits), is used to represent each succeeding sample value. This technique can provide data compression for ECG waveform data of about 2:1, however, results can vary greatly depending upon the nature of the original data, the delta value used, and the sampling rate.

For recovery of data having delta modulation compression, the value of the second sample is determined by combining the uncompressed initial sample value with the delta value of the second sample. Thereafter, in a sequential manner, the successive delta values are combined with the value determined for the preceding sample, to determine the value of the current sample. One problem with delta modulation is that even if the value change, the delta, between each of two successive original sample values exceeds the predicted limit, only the maximum delta value can be used. In this case the maximum delta value will continue to be used to represent each of the successive samples until the delta value can again accurately represent the true value of an original sample, i.e., the compression technique "catches up" to the true values. Thus, delta modulation compression is "slew-rate limited" (sometimes referred to as "lossy"), since at high slew-rates the compressed data samples can lose some of the information contained in the original data samples.

The present inventor is aware of a modified version of delta modulation, wherein, as in the original version, if the succeeding sample value is within the predicted limit, only the bits required to represent the delta sample value are used. However, if the predicted limit is exceeded, the complete original sample, i.e., not-compressed, is used. A preamble or header bit of 0 or 1 is used in front of the group of bits representing each sample in the compressed data stream to indicate if that group of bits is representative of a compressed or not-compressed sample value. One problem with this technique is that the signal processing for compression and de-compression is undesirably processing intensive. That is, if the signal processing is operating with, for example, 8-bit bytes, the insertion of the 1-bit header bits before each sample to indicate a compressed value or not-compressed value for that sample necessitates undesirable bit-shifting and masking operations.

It would be desirable to provide a data compression technique which would not be slew-rate limited, and at the same time avoid the complex bit-shifting and masking operations necessary to insert the header bits before each sample.

SUMMARY OF THE INVENTION

In accordance with the principles of the present invention, a data compression technique is disclosed that produces a compressed data stream that comprises both compressed and not-compressed data samples, as well as a separate "map" object that indicates which of the samples in the compressed data stream are representative of one of the compressed original samples and not-compressed original samples.

In accordance with a further aspect of the invention, the "map" object is advantageously used by the data consumer for signal analysis purposes, such as for an activity or value detector. For example, when the data samples are representative of the value of successive samples of an ECG waveform, the fast amplitude changes at the QRS portion of the waveform can quickly be identified by merely looking at the map. That is, the bits of the map are, in an absolute value sense, indicative of waveform activity. Thus, if 8 successive bits in the map equal one byte, the value of each byte in the map contains information about eight data samples. Consequently, the data consumer can quickly get an idea of waveform activity by a simple analysis or reference to a single byte of the map, rather than by bit-by-bit analysis of each of eight successive data samples. Such bit-by-bit analysis would not only be time consuming but would also be computationally intensive since decompression of the eight data samples would be required before such analysis could be performed.

Additionally, in an ECG application of the invention, it would be easy to combine map objects from different pairs of ECG electrodes in order to produce an even more reliable indicator of QRS detection.

These and other objects and advantages of the invention will now be described, in conjunction with the following drawings and description of the preferred embodiment.

DETAILED DESCRIPTION OF THE INVENTION

Initially, it is noted that the data compression approach of the present invention, although particularly useful for compressing ECG waveform signals, is also applicable for compressing many other types of signals. Additionally, although the invention is described in conjunction with a delta modulation type of data compression, other types of compression techniques could be used which can take advantage of this invention, such as other types of direct data compression (tolerance-comparison and entropy coding), as well as transformation methods or parameter extraction techniques (e.g., Karhunen-Loeve, etc).

In general, an ECG waveform contains QRS events that are composed of frequency components that are higher than other portions of the waveform. Consequently, the waveform is sampled at a higher rate than most other types of physiological data and, therefore, consumes a large portion of any communication channel or storage medium that is used for transmitting or storing this type of physiological data.

Additionally, waveform data makes up most of the information produced by a monitor or transmitter. Both telemetered data and patient monitor data are considered herein, since telemetered data is composed primarily of waveforms and generally does not include derived parameter information, while patient monitors may produce larger numbers of waveforms as well as parameter and alarm data.

The purpose of compressing the data is to improve communication performance. The wireless medium, in particular, is limited in bandwidth. Compression cannot, on the other hand, "throw the baby out with the bath water". The information in the data must be maintained. Because of real-time constraints, a compression process must be relatively fast without making high demands on a processor.

Figure 1:
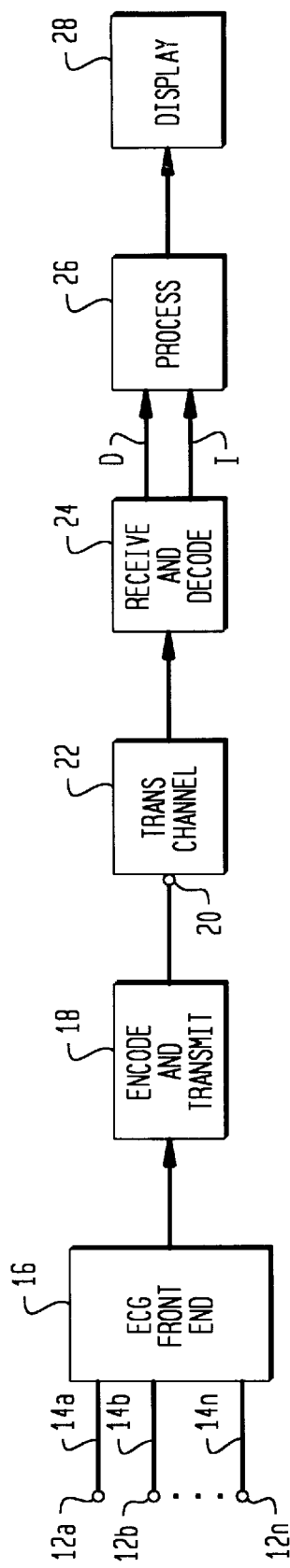
FIG. 1 illustrates in block diagram form a portable patient monitoring system which uses a data compression technique in accordance with the present invention.

FIG. 1 illustrates an application of the present invention in the environment of a system for monitoring the physiological condition of a patient. For the sake of simplicity, only the monitoring of electrocardiographic (ECG) signals are described, although it should be clear that other physiological conditions can also be monitored, such as blood pressure, respiration, blood oxygen saturation, temperature, etc. In the event more than one physiological condition is monitored, the signals representing these conditions can be combined with the acquired ECG signals in accordance with any one of many well known signal combining techniques, such as time division multiplexing.

As shown in FIG. 1, a plurality of electrodes 12a, 12b . . . 12n are attached to a patient (not shown) in a manner well known to those of ordinary skill in the art, for acquiring electrocardiographic signals from the patient, which are coupled, via respective signal conductors 14a, 14b, . . . 14n to an ECG front end 16. As well known to those of ordinary skill in this technology, an ECG front end combines the acquired ECG signals into conventional ECG lead signals. ECG front end 16 includes an analog-to-digital converter for providing at its output digital samples representative of the amplitude value of successive portions of the ECG lead signals (sometimes referred to as ECG waveform samples). In the event that the ECG waveform is to be displayed at a location remote from ECG front end 16, it is necessary to transmit the digitized ECG waveform data to another location. Conventionally a wireless link or RF link is used, which has an appropriate bandwidth for transmitting the digitized ECG waveform data. Conventionally, data compression is required and an encode and transmit circuit portion 18 is provided which is responsive to the digitized ECG waveform samples for encoding them so as to reduce their bandwidth using one of several well known data compression techniques, and thereafter providing compressed ECG waveform samples at an output 20. From output 20 the compressed data samples are passed through a transmission channel 22 which may comprise a wireless link, a data storage device (such as magnetic tape) or other data transmission channel. Thereafter, the data is recovered by a receive and decode circuit portion 24 which recovers the compressed data samples from the transmission channel 22 and decodes the compressed data so as to recover and reproduce the original ECG waveform samples. The original samples are then applied to a signal processor 26 which processes the waveform sample in a manner well known to those of ordinary skill in the art for application to a display 28 wherein the waveforms are displayed for use by the user. As generally described so far, the apparatus of FIG. 1 is constructed and operates in accordance with signal processing techniques well known to those of ordinary skill in the art. However, in accordance with the principles of the present invention, a new technique for data compression/decompression is employed. This new technique is generally shown in FIG. 2.

Figure 2:
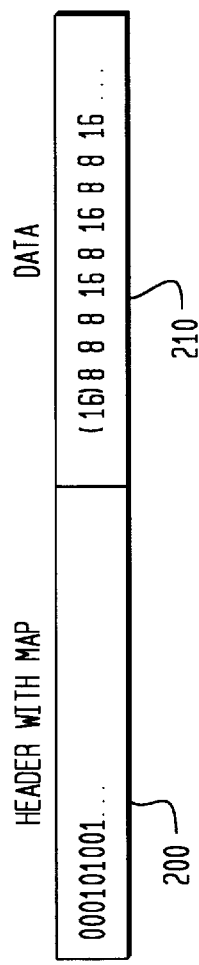
FIG. 2 illustrates a packet diagram used by the FIG. 1 embodiment for transmitting compressed data in accordance with the present invention.

FIG. 2 illustrates a transmission packet diagram showing the arrangement of the compressed ECG waveform data as it is transferred from encode and transmit circuit portion 18, through channel 22 to the receive and decode circuit portion 24. As illustrated therein, the stream of compressed digital data is packetized into first and second portions. The first portion comprises a bitfield header 200 followed by a datafield 210. Datafield 210 includes a sequence of bytes having a value representative of sequential samples of the ECG data. The bitfield header (also referred to herein as a "map") comprises an array of 0's and 1's which indicate which of the data samples in datafield 210 are compressed or uncompressed. Thus, a 0 in map portion 200 indicates that the corresponding data sample in datafield 210 is compressed data, while a 1 in map portion 200 indicates that the data sample in datafield 210 is uncompressed. It should be noted, that alternatively, a 1 in map can be used to indicate the compressed data sample, while a 0 in map indicates an uncompressed data sample. Furthermore, even if only the position (order) of only one of the compressed or uncompressed samples is indicated by the map bits, the position of the other samples could be inferred by a process of elimination.

As discussed in the Background portion of the present application, in order to provide a lossless data compression technique, it is sometimes necessary to not compress the original data because it's value change exceeds the dynamic range of the bits used to describe the compressed sample. For example, when delta modulation compression is being utilized as the compression technique, in the event that adjacent original samples have a value change which exceeds the dynamic range of the delta value, an uncompressed original sample is sent in datafield 210. Correspondingly, the position of that uncompressed data sample in datafield 210 is represented by a "1" in the map portion 200 of the transmission packet.

In a preferred embodiment, the ECG waveform data is initially digitized by ECG front end 16 into 16-bit samples. Using a delta modulation compression technique, after a "not compressed" data sample is sent as the initial sample in the first data slot of the data portion of the packet, thereafter only a delta, using less bits, is sent to represent the change in value between successive samples. In the illustrated embodiment, 16-bit data is used for the original samples and an 8-bit delta is used (+/−128). The data packet illustrated in FIG. 2 shows the first sample in parenthesis, since, as previously noted its sent not compressed so that it can be used as the starting point for modification by the subsequent delta,. Furthermore, since the first sample is always sent not compressed, it is not necessary to represent it in the map portion. Thus, the first three "0"'s in the map portion 200 of FIG. 2 shows that after the initial not-compressed sample, the first three data samples of data portion 210 are compressed, and therefore represented by an 8-bit delta value, rather than the 16-bit uncompressed initial data sample. Note, that the fourth, sixth, and ninth samples in the data portion 210 are sent uncompressed, i.e. with 16-bits.

The described modified DPCM scheme with an appropriately selected delta size can achieve a 1.6–1.9 compression ratio when applied to ECG data.

Referring again to FIG. 1, it is noted that the receive and decode circuit portion 24 uses the information in the map portion 200 in order to identify the compressed data samples in the data portion 210, and thereby speed-up and simplify the de-compression of the transmitted data. In the event that in an alternative embodiment of the invention separate sections of data portion 210 are used for the compressed and not-compressed data samples, the information in map portion 200 is used to determine the order or sequence for reconstructing the original data sample stream from the compressed and not-compressed data samples.

In accordance with a further aspect of the present invention, as a side-effect of the above-described new compression technique, the map object can also be used as a discriminator function for discriminating, for example, ECG QRS complexes.

That is, computational effort required to produce the present compression technique can be leveraged by consumers of the compressed data for algorithmic purposes, such as, in an ECG application, QRS detection or beat classification. This is so because the information contained in the map is indicative of waveform activity in an absolute value sense. An activity indication signal is not specifically shown, but conducted along signal path "I" between circuit portions 24 and 26 shown in FIG. 1 (note, signal path "D" is for transmission of the de-compressed data to processor 26). The value of each byte in map 200 contains information about eight data samples in data portion 210. Thus, the consumer of the data can quickly and easily get information about a characteristic of the data that the compressed samples are representative of, such as its amplitude change activity, by referencing a single byte of map 200. With the prior art compression techniques, it would be necessary to examine eight samples of the compressed data to get the activity information content of a single byte of the map. Furthermore, in the prior art techniques, it would normally also be required that the compressed data samples be de-compressed before the activity information could be obtained.

The present invention is particularly effective with 16-bit ECG data and 8-bit deltas since bit shifting is not required. Because the map and data samples are in separate portions of a memory associated with the processing, the time consuming bit shifting of the data and the setting of flags is not required. Other data sizes may also be used in the general case, but the computation required for compression is more.

In accordance with an even further aspect of the present invention, not specifically shown, map objects produced from data compression using the technique of FIG. 2 on different pairs of ECG electrodes can be combined to produce a more reliable QRS indicator.

In accordance with a still further aspect of the present invention, not specifically shown, the map object itself may be compressed, since this array is generally sparse with respect to ECG data. This compression may be a simple form of Huffman encoding. If the compression is working, then the map should be made up mostly of NULL bytes. These NULL bytes can be represented by single bits.

As noted above, one feature of the present invention is that the compression map 200 may be used to indicate activity in the waveform, and in fact may provide a good indication of correlation between or among a plurality of waveforms.

That is, each bit value in the map is a logical relation described as:

$$\Gamma = (|\Delta| \geq x)$$

where $\Delta$ is the sample difference and x is the delta threshold. Thus, the bit position of a bit within the map is not important, but the number of bits in closed proximity can serve as a key discriminator of waveform activity.

For example, a single waveform discriminator can count the number of map bits set (i.e., to a "1") over a certain time window. For efficiency and speed purposes, the time window could be forced to be on a byte boundary. The count of set bits could be done with a look-up table. For analysis of multiple waveforms, analysis would simply involve combining the individual discriminator outputs.

For completeness sake, it is also noted that the transmission packets also include a header for "housekeeping information", such as the number of samples contained in the data portion, the size of samples and the delta, and in general other information of this type. Additionally, the transmission packets can have other portions for sending other types of data in addition to sampled waveform data, for example processed data such as blood pressure and other physiological values, as well as status data. This data may also be re-assembled using the compression map.

Figure 3:
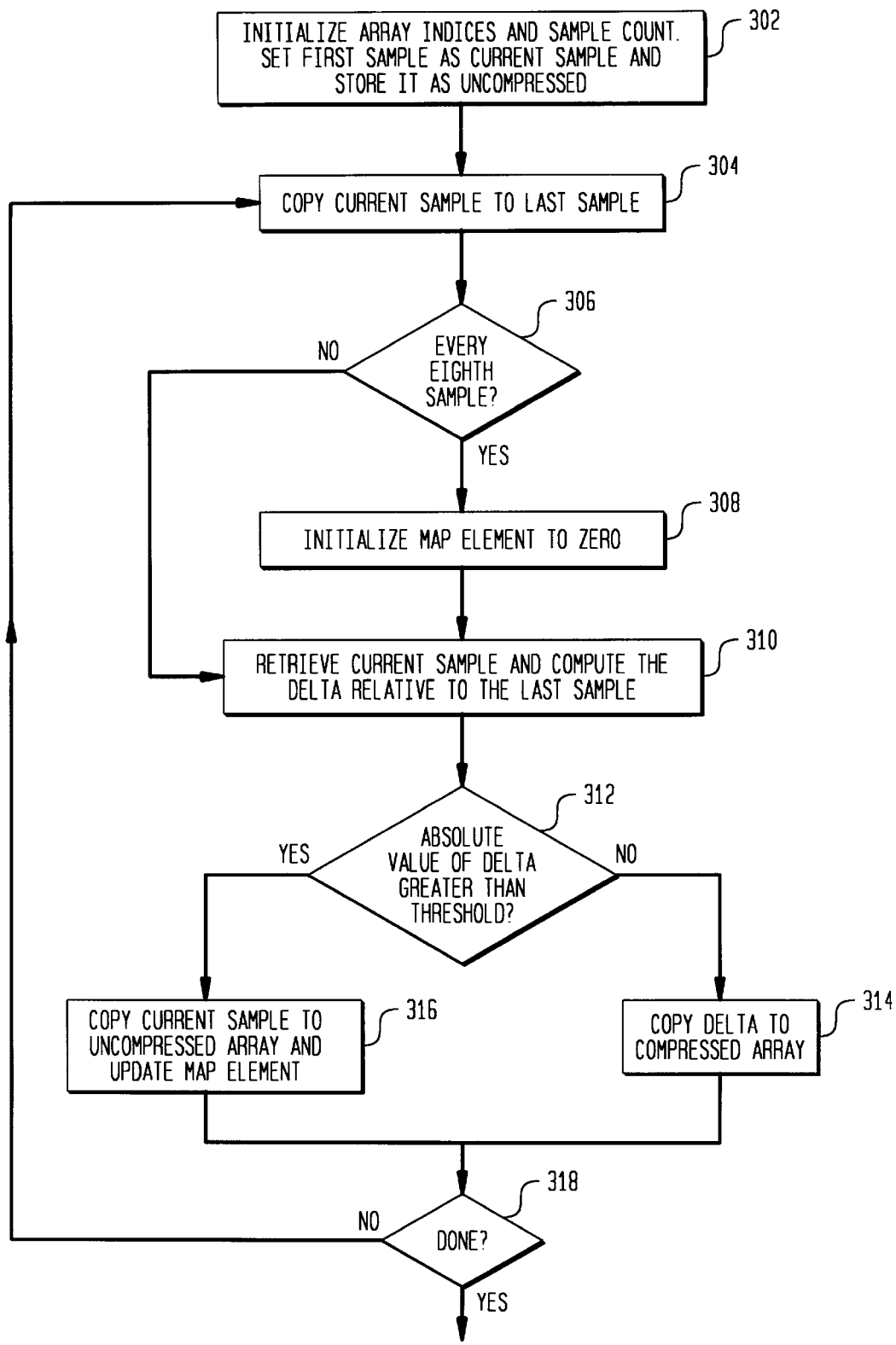
FIG. 3 illustrates a flow chart useful for understanding a data encoding compression technique operating in accordance with the present invention.

FIG. 3 illustrates a flow chart useful for understanding a data encoding compression technique operating in accordance with the present invention. The flow chart is basically self explanatory, however for the sake of completeness, some additional description will now be provided. Step 302 initializes system and provides, as previously noted, the first sample from the stream of original samples as the first sample in datafield 210. Steps 304 through 310 obtain the next sample from the stream of original samples, and set-up the bit sequence of mapfield 200. Steps 312, 314 and 318 develops the sequence of compressed data samples for datafield 210, and steps 312, 316 and 318 develops the sequence of not-compressed data samples for datafield 210.

Figure 4:
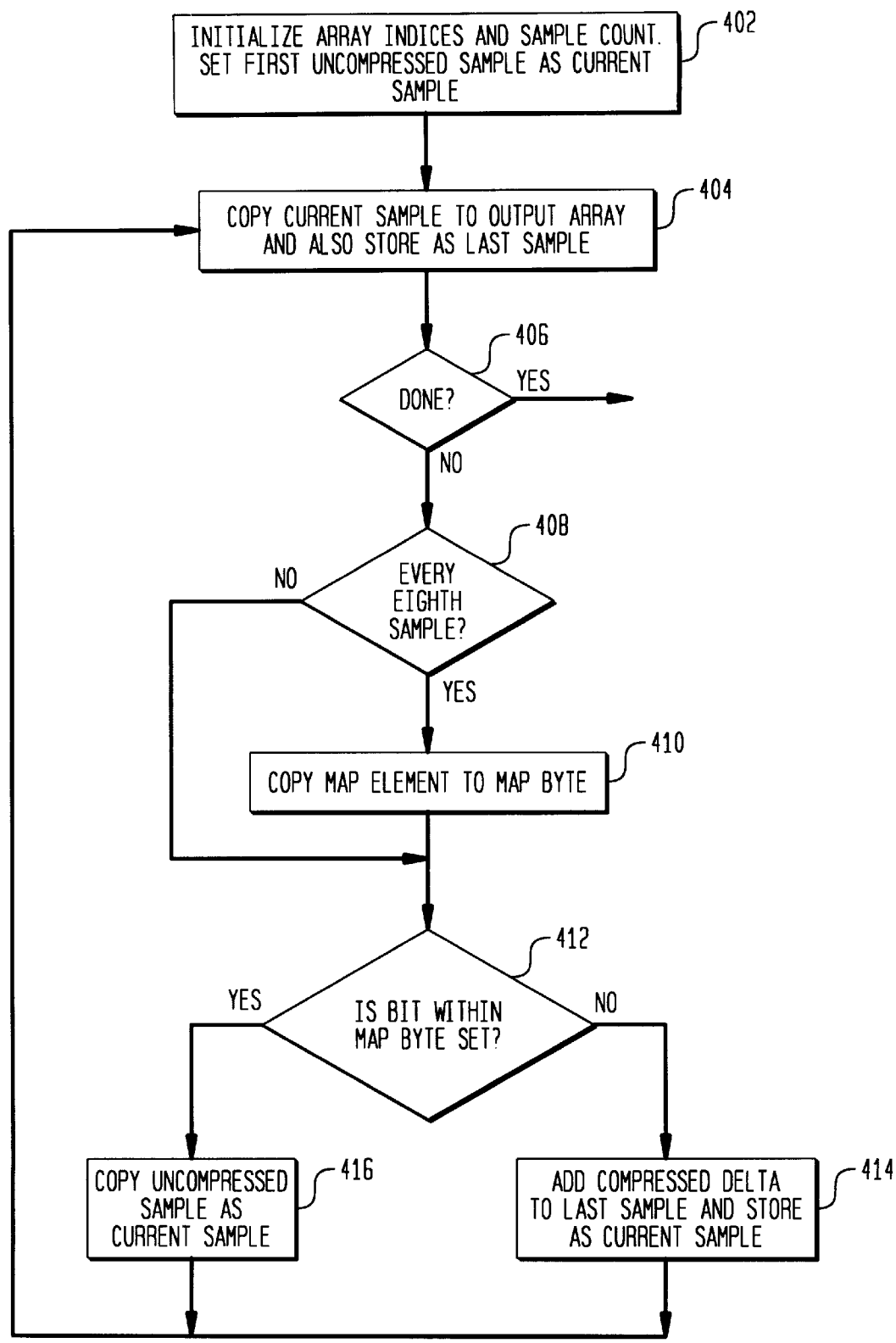
FIG. 4 illustrates a flow chart useful for understanding a data decoding technique operating in accordance with the present invention for recovering data encoded in accordance with the technique shown in FIG. 3.

FIG. 4 illustrates a flow chart useful for understanding a data decoding technique operating in accordance with the present invention for recovering data encoded in accordance with the technique shown in FIG. 3. Like FIG. 3, the flow chart is basically self explanatory, however for the sake of completeness, some additional description will now be provided. Step 402 initializes the system and provides, as previously noted, the first sample from datafield 210 as the first sample in the data stream reconstruction of the original data samples. Steps 408 through 412 determine the position of samples in datafield portion 210 that are compressed and are not compressed. If a sample is identified as compressed, its delta value is added to the value of the last sample and it is then stored as the current sample. If a sample is identified as not-compressed, its value is then stored as the current sample. Steps 404 and 406 cause the forenoted process to be repeated until the last sample in datafield 210 has been processed.

Thus, what has been shown and described is a novel method and apparatus for data compression which fulfills all the objects and advantages sought therefore. Many changes, modifications, variations and other uses and applications of the subject invention will, however, become apparent to those skilled in the art after considering this specification and its accompanying drawings, which disclose preferred embodiments thereof. For example, as previously noted, other types of data compression could be used in conjunction with the invention. Furthermore, although in the preferred embodiment the compressed data samples are intermixed with the not-compressed data samples in the data portion of the packets, as previously noted, separate sections of the data portions of the packets could be used for the compressed and not-compressed data samples, with the information in the map portion allowing proper re-ordering of the compressed and not-compressed data samples. All such changes, modifications, variations and other uses and applications which do not depart from the spirit and scope of the invention are deemed to be covered by this patent, which is limited only by the claims which follow as interpreted in light of the foregoing description.

I claim:

1. A data compression technique for processing a stream of original data samples to produce a compressed data stream that comprises both compressed and not-compressed data samples, comprising:

a data compression means for applying a data compression technique to said original data samples so as to develop a sequence of compressed original samples and not-compressed original samples, and providing said sequence of samples in a data portion of a transmission packet; and a compression indicator means for developing a sequence of bits indicating which of the samples in the data portion of a transmission packet are representative of one of compressed original samples and not-compressed original samples, and providing said sequence of bits in a map portion of said transmission packet which is separate from said data portion of said transmission packet.

2. The apparatus of claim 1, wherein the data portion of said transmission packet includes separate sub-sections for said compressed original samples and not-compressed original samples, respectively.

3. The apparatus of claim 1, wherein the data portion of said transmission packet includes said compressed original samples and not-compressed original samples in an intermixed order, as indicated by the sequence of bits in the map portion of the transmission packet.

4. The apparatus of claim 1, wherein said data compression means applies a delta modulation data compression technique to said original data samples.

5. The apparatus of claim 1, wherein said original data samples comprise successive samples of a sampled electrocardiographic waveform.

6. A receiver for receiving transmission packets, each packet having a data portion including a sequence of both compressed and not-compressed data samples representative of a sequence of original data samples, and having a map portion, which is separate from the data portion, including a sequence of bits indicating the order in which the compressed original samples are to be presented in a reconstruction of said sequence of original data samples, comprising:

a data de-compression means responsive to said compressed and not-compressed data samples in said data portion of said transmission packets for applying a data de-compression technique to said compressed original samples and developing a data stream representative of said original data samples; and indication means responsive to said sequence of bits in said map portion, for generating a compression indication signal and providing said compression indication signal to said data decompression means for indicating the order in which the compressed original samples are to be presented in said data stream representative of said original data samples.

7. The receiver of claim 6, further including processing means, responsive to said sequence of bits in said map portion, for generating a characteristic indication signal for indicating a characteristic of the data for which said sequence of original data samples is representative.

8. The receiver of claim 7, wherein said processing means comprises an activity detector for generating as said characteristic indication signal a signal that indicates portions of said sequence of original data samples that are representative of magnitude changes that are greater than a predetermined threshold.

9. The receiver of claim 8, wherein said original data samples are representative of an ECG waveform, and said characteristic indication signal indicates a QRS portion of the ECG waveform.

10. The receiver of claim 9, wherein a plurality of said transmission packets include data portions and corresponding map portions representative of a plurality of ECG waveforms, and further including:

means for combining the bits a plurality of said map portions to produce said indication signal.

11. A method for data compression of a stream of original data samples to produce a compressed data stream that comprises a combination of both compressed and not-compressed data samples, comprising the following steps:

applying a data compression technique to said original data samples so as to develop a sequence of compressed original samples and not-compressed original samples, and providing said sequence of samples in a data portion of a transmission packet; and developing a sequence of bits indicating which of the samples in the data portion of the transmission packet are representative of one of said compressed and not-compressed original samples, and providing said sequence of bits in a map portion of said transmission packet which is separate from said data portion of said transmission packet.

12. The method of claim 11, wherein the providing step of said applying step, comprises providing in the data portion of said transmission packet separate sub-sections for said compressed original samples and not-compressed original samples, respectively.

13. The method of claim 11, wherein the providing step of said applying step, comprises providing in the data portion of said transmission packet said compressed original samples and not-compressed original samples in an intermixed order, as indicated by the sequence of bits in the map portion of the transmission packet.

* * * * *